(12) United States Patent
Kojima

(10) Patent No.: US 7,679,269 B2
(45) Date of Patent: Mar. 16, 2010

(54) LIQUID TRANSPORTING APPARATUS AND PIEZOELECTRIC ACTUATOR

(75) Inventor: Masatomo Kojima, Ichinomiya (JP)

(73) Assignee: Brother Kogyo Kabushiki Kaisha, Nagoya-shi (JP)

( * ) Notice: Subject to any disclaimer, the term of this patent is extended or adjusted under 35 U.S.C. 154(b) by 0 days.

(21) Appl. No.: 12/328,936

(22) Filed: Dec. 5, 2008

(65) Prior Publication Data

US 2009/0146532 A1 Jun. 11, 2009

(30) Foreign Application Priority Data

Dec. 7, 2007 (JP) ............................. 2007-316872

(51) Int. Cl.
H01L 41/08 (2006.01)
(52) U.S. Cl. .................... 310/328; 310/323.01
(58) Field of Classification Search ................ 310/328, 310/363–366, 323.01, 323.06; H01L 41/08
See application file for complete search history.

(56) References Cited

U.S. PATENT DOCUMENTS 6,338,551 B1 * 1/2002 Sugiura et al. ............... 347/71
6,575,565 B1 * 6/2003 Isono et al. .................. 347/71
6,979,074 B2 12/2005 Watanabe

FOREIGN PATENT DOCUMENTS

| JP | 9-272202 | 10/1997 |
|---|---|---|
| JP | 2003-311983 | 11/2003 |
| JP | 2004-114342 | 4/2004 |

* cited by examiner

Primary Examiner—Walter Benson
Assistant Examiner—Karen B Addison
(74) Attorney, Agent, or Firm—Reed Smith LLP

(57) ABSTRACT

First and second piezoelectric thin layers are arranged on an upper surface of a vibration plate which covers a pressure chamber. An individual electrode is formed on an upper surface, of the second piezoelectric thin layer, at a portion facing the pressure chamber, and a connecting terminal to be connected to a FPC wire via solder is arranged to be separated from the individual electrode at a portion not facing the pressure chamber. A common electrode is formed on a lower surface of the first piezoelectric thin layer to face the pressure chamber. A connecting portion which faces the individual electrode and the connecting terminal and does not face the common electrode is formed between the first and the second piezoelectric thin layers. The individual electrode, the connecting terminal, and the connecting portion are connected via an electroconductive material filled in communicating passages formed in the second piezoelectric thin layer.

11 Claims, 10 Drawing Sheets

LIQUID TRANSPORTING APPARATUS AND PIEZOELECTRIC ACTUATOR

CROSS REFERENCE TO RELATED APPLICATION

The present application claims priority from Japanese Patent Application No. 2007-316872, filed on Dec. 7, 2007, the disclosure of which is incorporated herein by reference in its entirety.

BACKGROUND OF THE INVENTION

1. Field of the Invention

The present invention relates to a liquid transporting apparatus which transports a liquid, and a piezoelectric actuator.

2. Description of the Related Art

In an ink-jet recording head described in Japanese Patent Application Laid-open No. 2003-311983, an individual electrode is arranged, on an upper surface of a piezoelectric layer, at a portion facing an ink chamber (pressure chamber), and a connecting electrode (connecting terminal) is connected to an end portion of the individual electrode. The connecting electrode has a base layer which is made of a metallic material having low wettability and is connected to the individual electrode, and an electrode drawing layer which is formed on an upper surface of the base layer at an area excluding a peripheral portion of the base layer. When the electrode drawing layer and a power supply terminal are connected by solder, the solder stops at a base layer having low wettability and is prevented from flowing to a surface of the individual electrode. Accordingly, a deformation of the piezoelectric layer is prevented from being inhibited by the solder which has flowed to the individual electrode.

However, in the ink-jet recording head described in Japanese Patent Application Laid-open No. 2003-311983, as the electrode drawing layer is formed at a substantially central portion of the upper surface of the base layer, an area of the electrode drawing layer is small with respect to the connecting electrode. Consequently, even if the electrode drawing layer is formed of a material having wettability higher than that of the base layer, when an amount of solder at the time of connecting the electrode drawing layer and the power supply terminal is large, there is a possibility that the solder crosses over the electrode drawing layer and flows to the base layer. Moreover, the individual electrode and the connecting electrode are connected on an upper surface of the piezoelectric layer at which the connecting terminal and the power supply terminal are connected by the solder. As a result, the solder flows to the surface of the individual electrode via a connecting portion of the individual electrode and the connecting electrode, and there is a possibility that the deformation of the piezoelectric layer is inhibited by the solder which has flowed to the surface of the individual electrode.

SUMMARY OF THE INVENTION

An object of the present invention is to provide a liquid transporting apparatus and a piezoelectric actuator in which it is possible to prevent assuredly the solder etc. from flowing from a connecting terminal to a surface of a drive electrode.

According to a first aspect of the present invention, there is provided a liquid transporting apparatus which transports a liquid, including: a channel unit having a liquid transporting channel which includes a pressure chamber and through which the liquid is transported; and a piezoelectric actuator which applies a pressure to the liquid in the pressure chamber, the piezoelectric actuator including; a vibration plate covering the pressure chamber; a piezoelectric layer disposed on a surface, of the vibration plate, not facing the pressure chamber; a drive electrode which is formed on a surface, of the piezoelectric layer, not facing the vibration plate and which faces the pressure chamber; a connecting terminal which is formed on the surface, of the piezoelectric layer, not facing the vibration plate to be separated from the drive electrode, and which is connectable to an external wire; a connecting portion which is formed on the piezoelectric layer and which connects the drive electrode and the connecting terminal; and a first communicating passage and a second communicating passage which are formed in the piezoelectric layer; and the connecting portion is formed at a position, in a thickness direction of the piezoelectric layer, which is different from a position at which the drive electrode and the connecting terminal are formed; the drive electrode and the connecting portion are connected via an electroconductive material which is filled in the first communicating passage; and the connecting portion and the connecting terminal are connected via an electroconductive material which is filled in the second communicating passage.

In a case in which the drive electrode and the connecting terminal are connected on the surface on which the drive electrode and the connecting terminal are formed, when the connecting terminal and the external wire are connected by solder etc., the solder flows from the connecting terminal to a surface of the drive electrode. As a result, there is a possibility that the deformation of the piezoelectric layer and the vibration plate is inhibited when a driving electric potential is applied to the drive electrode. However, in the present invention, the drive electrode and the connecting terminal are formed to be separated from each other, and the drive electrode and the connecting terminal are connected via the connecting portion which is formed at a position different from the position of the drive electrode and the connecting terminal in the thickness direction of the piezoelectric layer. Therefore, the solder does not flow from a surface of the connecting terminal to the surface of the drive electrode.

The liquid transporting apparatus of the present invention may further include a reference electrode which is formed on the piezoelectric layer to face the drive electrode and which is kept at a predetermined reference electric potential, and the reference electrode may be formed at a position, in the thickness direction of the piezoelectric layer, which is different from the position at which the drive electrode and the connecting terminal are formed, and the reference electrode may not face the connecting terminal. In this case, since the reference electrode and the connecting terminal do not face, it is possible to prevent a generation of a stray capacitance between the reference electrode and the connecting terminal.

In the liquid transporting apparatus of the present invention, the piezoelectric layer may be formed by a plurality of thin layers which are stacked with each other, and the connecting portion and the reference electrode may be formed on different surfaces of the thin layers respectively. In this case, since the reference electrode and the connecting portion are formed on the different surfaces of the thin layers respectively, it is possible to prevent the reference electrode and the connecting portion from getting shorted In the liquid transporting apparatus of the present invention, the connecting portion and the reference electrode may not face with each other. In this case, it is possible to prevent a generation of the stray capacitance between the reference electrode and the connecting portion.

In the liquid transporting apparatus of the present invention, the connecting terminal may not face the pressure chamber. In this case, since the connecting terminal does not face the pressure chamber, it is possible to prevent assuredly the deformation of the piezoelectric layer and the vibration plate from being inhibited due to the solder adhered to the connecting terminal when the connecting terminal and an external wire are connected.

The liquid transporting apparatus of the present invention may further include a reference electrode which is formed entirely on a surface, of the piezoelectric layer, facing the vibration plate and which is kept at a predetermined reference electric potential. In this case, it is possible to form the reference electrode easily.

The liquid transporting apparatus of the present invention may further include a reference electrode which is formed on a surface, of the piezoelectric layer, facing the vibration plate to face the drive electrode and which is kept at a predetermined reference electric potential, and the connecting portion may be formed on the surface, of the piezoelectric layer, facing the vibration plate to be separated from the reference electrode.

According to a second aspect of the present invention, there is provided a piezoelectric actuator including: a vibration plate; a piezoelectric layer which is arranged on one surface of the vibration plate; a drive electrode which is formed on a surface, of the piezoelectric layer, not facing the vibration plate; a connecting terminal which is formed on the surface, of the piezoelectric layer, not facing the vibration plate to be separated from the drive electrode; a connecting portion which is formed on the piezoelectric layer, and which connects the drive electrode and the connecting terminal, and a first communicating passage and a second communicating passage which are formed in the piezoelectric layer; and the connecting portion is formed at a position, in a thickness direction of the piezoelectric layer, which is different from a position at which the drive electrode and the connecting terminal are formed; the drive electrode and the connecting portion are connected via an electroconductive material which is filled in the first communicating passage; and the connecting portion and the connecting terminal are connected via an electroconductive material which is filled in the second communicating passage.

In a case in which the drive electrode and the connecting terminal are connected on the surface on which the drive electrode and the connecting terminal are formed, when the connecting terminal and the external wire are connected by solder etc., the solder flows from the connecting terminal to a surface of the drive electrode. As a result, there is a possibility that the deformation of the piezoelectric layer and the vibration plate is inhibited when a driving electric potential is applied to the drive electrode. However, in the present invention, the drive electrode and the connecting terminal are arranged to be separated from each other, and the drive electrode and the connecting terminal are connected via the connecting portion which is formed at a position different from the position of the drive electrode and the connecting terminal in the thickness direction of the piezoelectric layer. Therefore, the solder does not flow from a surface of the connecting terminal to the surface of the drive electrode.

The piezoelectric actuator of the present invention may further include a reference electrode which is formed on the piezoelectric layer to face the drive electrode and which is kept at a predetermined reference electric potential, and the reference electrode may be formed at a position, in the thickness direction of the piezoelectric layer, which is different from the position at which the drive electrode and the connecting terminal are formed, and may not face the connecting terminal.

In the piezoelectric actuator of the present invention, the piezoelectric layer may be formed by a plurality of thin layers which are stacked with each other, and the connecting portion and the reference electrode may be formed on different surfaces of the thin layers respectively, Further, the connecting portion and the reference electrode may not face with each other.

DETAILED DESCRIPTION OF THE PREFERRED EMBODIMENTS

An exemplary embodiment of the present invention will be described below.

Figure 1:
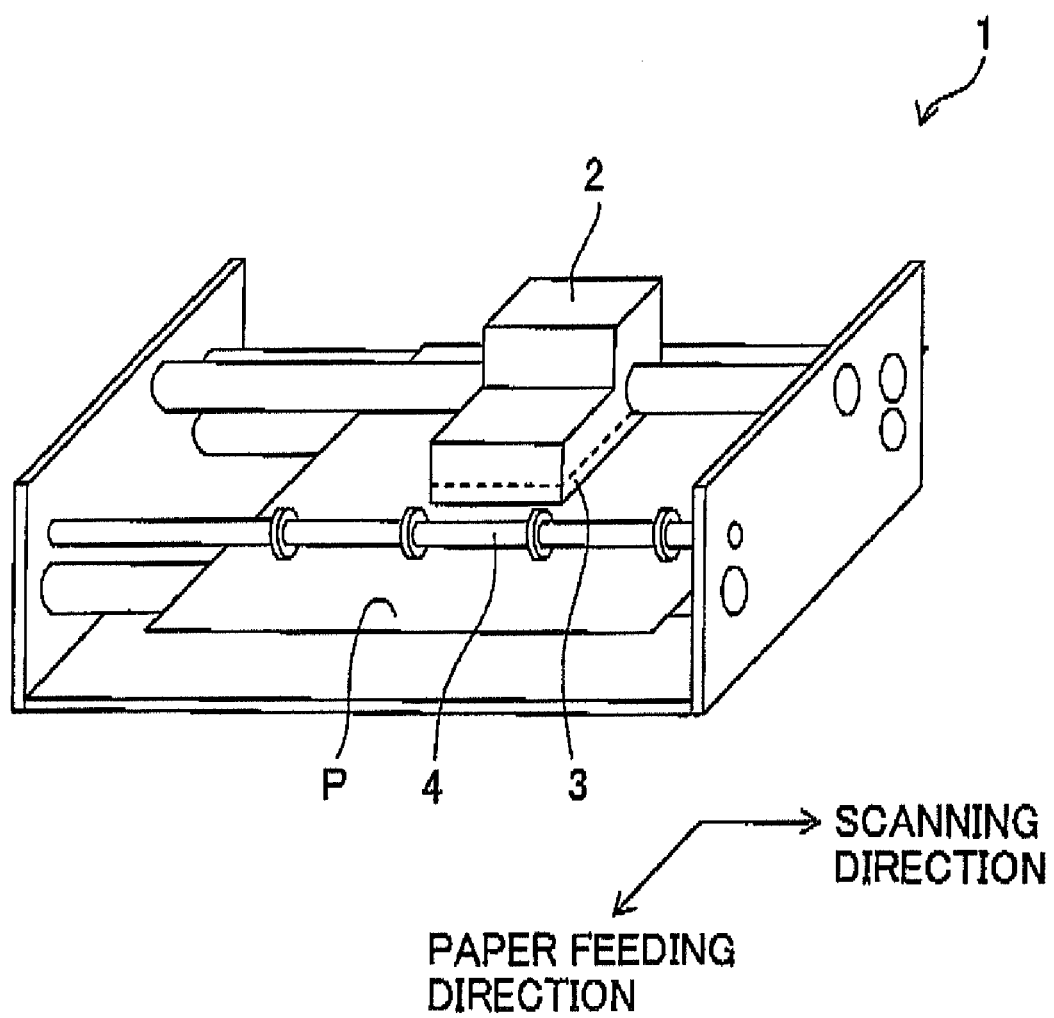
FIG. 1 is a schematic structural view of a printer according to an embodiment of the present invention.

FIG. 1 is a schematic structural view of a printer according to the embodiment of the present invention. As shown in FIG. 1, a printer 1 includes a carriage 2, an ink-jet head 3 (a liquid transporting apparatus), a paper transporting roller 4, and the like. The carriage 2 reciprocates in a left-right direction (scanning direction) in FIG. 1. The ink-jet head 3 is attached to a lower surface of the carriage 2, and jets an ink from nozzles 15 (refer to FIG. 2) which will be described later. The paper transporting roller 4 transports a recording paper P in a frontward direction (paper feeding direction) in FIG. 1. Moreover, in the printer 1, printing is performed on the recording paper P by jetting the ink from the nozzles 15 of the ink-jet head 3 which reciprocates in the scanning direction with the carriage 2 onto the recording paper P transported in the paper feeding direction by the paper transporting roller 4 (refer to FIG. 2).

Figure 2:
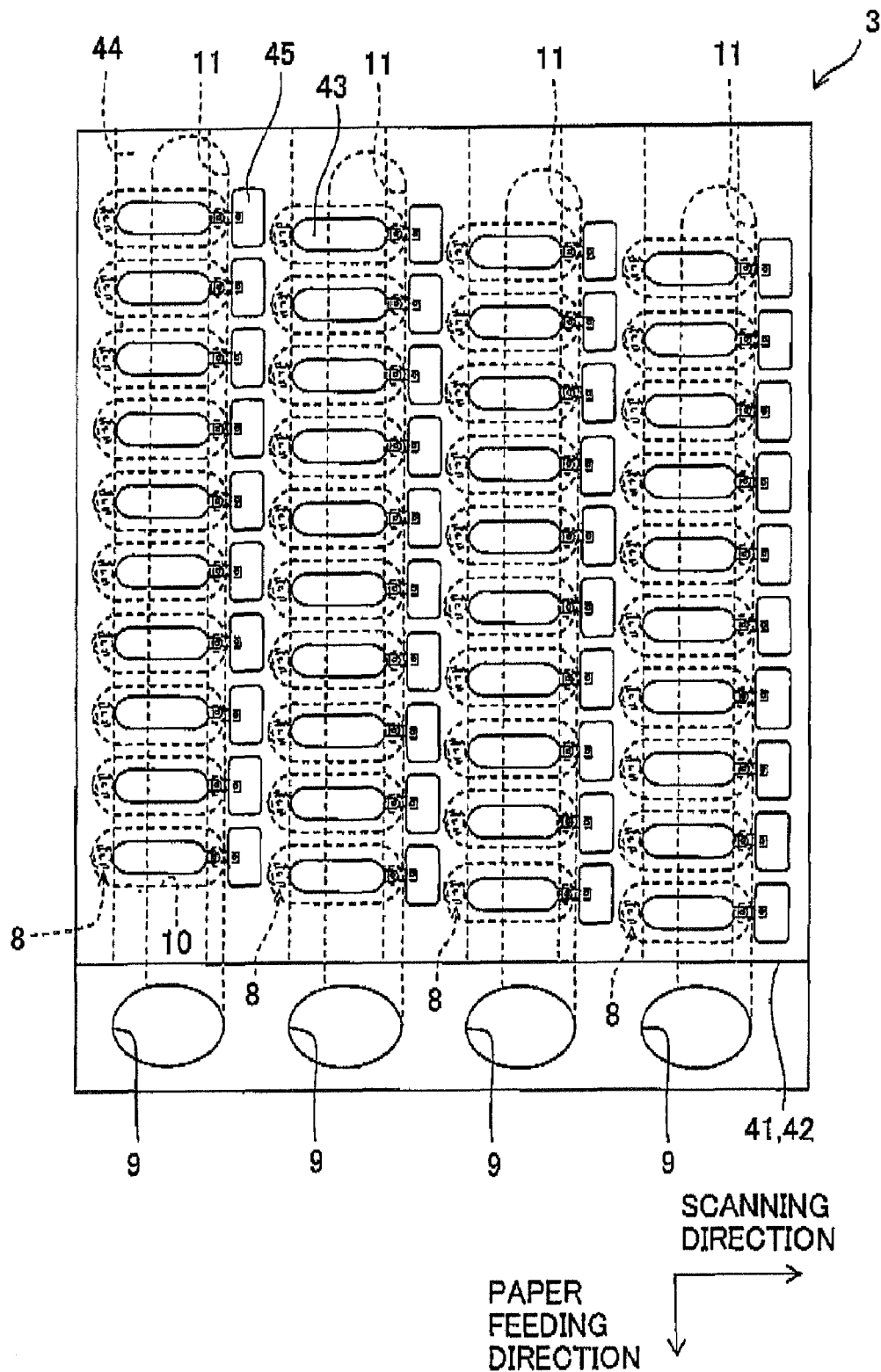
FIG. 2 is a plan view of an ink-jet head of the printer according to the embodiment of the present invention.
Figure 3:
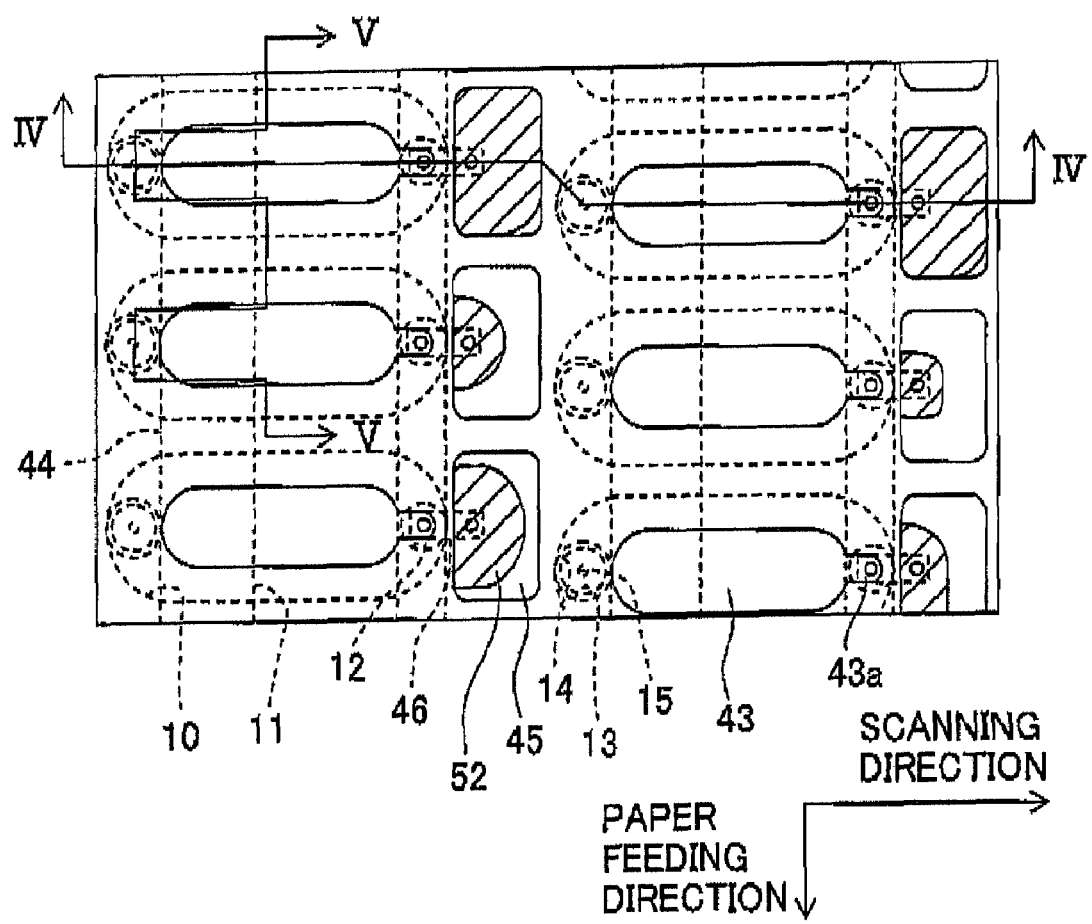
FIG. 3 is a partially enlarged view of FIG. 2.
Figure 4:
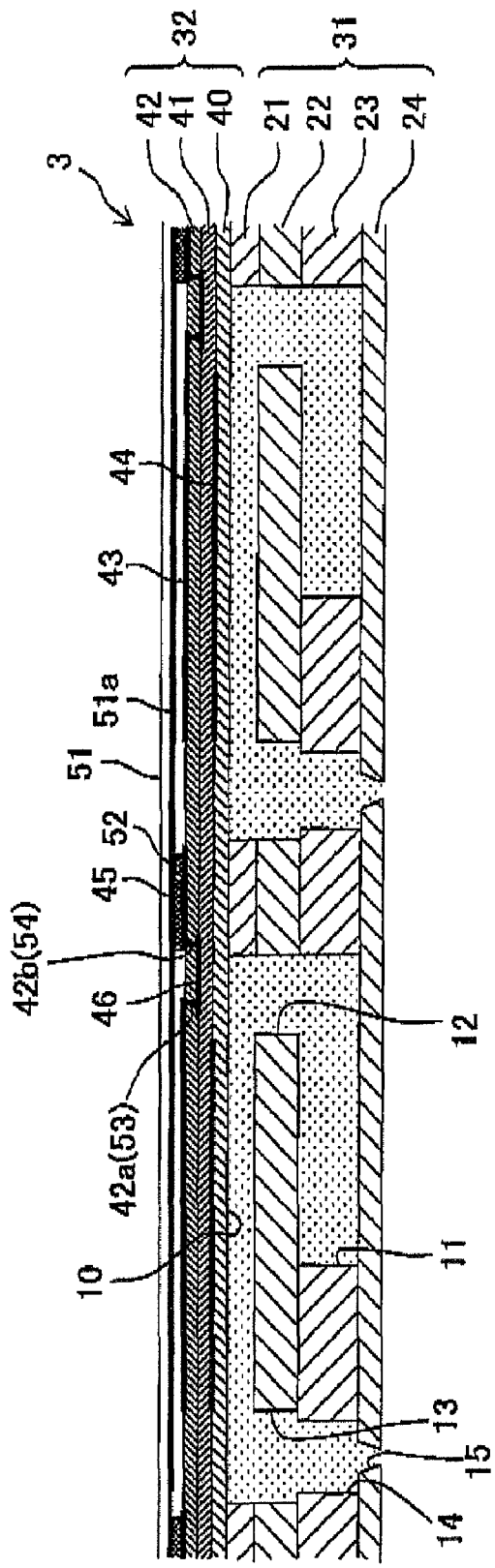
FIG. 4 is a cross-sectional view taken along a line IV-IV in FIG. 3.
Figure 5:
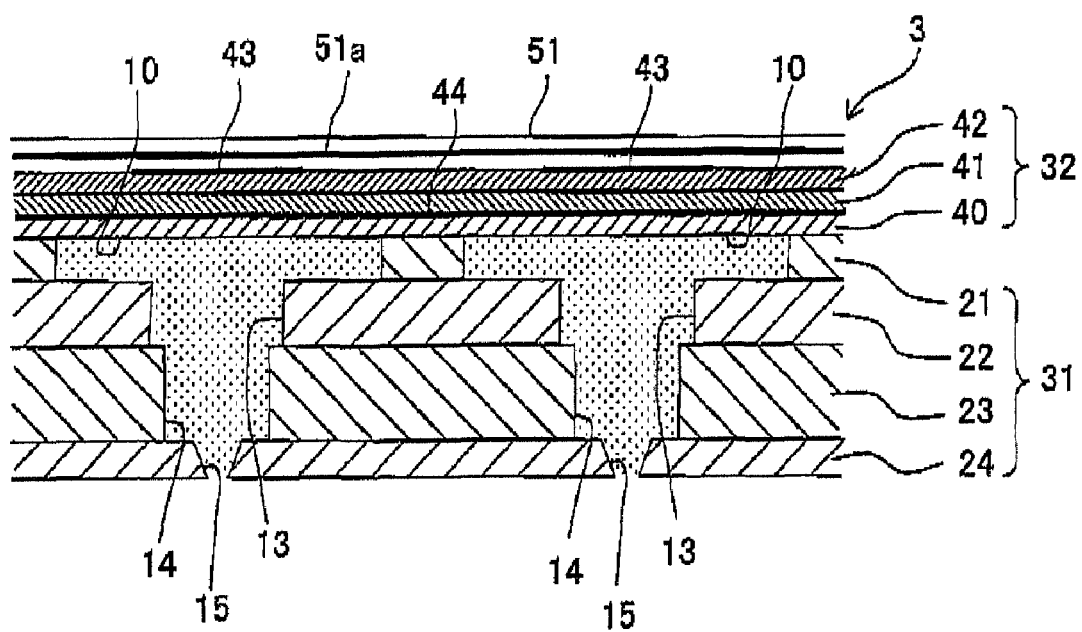
FIG. 5 is a cross-sectional view taken along a line V-V in FIG. 3.

Next, the ink-jet head 3 will be described below. FIG. 2 is a plan view of the ink-jet head 3 in FIG. 1. FIG. 3 is a partially enlarged view of FIG. 2. FIG. 4 is a cross-sectional view taken along a line IV-IV in FIG. 3. FIG. 5 is a cross-sectional view taken along a line V-V in FIG. 3.

As shown in FIG. 4 and FIG. 5, the ink-jet head 3 includes a channel unit 31 in which ink channels such as pressure chambers 10 are formed, and a piezoelectric actuator 32 which is arranged on an upper surface of the channel unit 31.

The channel unit 31 is formed by stacking four plates in order from an upper side, namely a cavity plate 21, a base plate 22, a manifold plate 23, and a nozzle plate 24. Out of these four plates 21 to 24, the three plates namely the cavity plate 21, the base plate 22, and the manifold plate 23 excluding the nozzle plate 24 are made of a metallic material such as stainless steel, and the nozzle plate 24 is made of a synthetic resin material such as polyimide. Or, the nozzle plate 24 may also be formed of a metallic material similarly as the other three plates 21 to 23.

A plurality of nozzles 15 is formed in the nozzle plate 24. The nozzles 15 are arranged along the paper feeding direction (vertical direction in FIG. 2) to form nozzle rows 8. Four such nozzle rows 8 are arranged in the scanning direction (left-right direction in FIG. 3). From the nozzles 15 included in the four nozzle rows 8, inks of black, yellow, cyan, and magenta color are jetted in order from the nozzle row 8 on a left side in FIG. 2, respectively.

A plurality of pressure chambers 10 is formed in the cavity plate 21, corresponding to the plurality of nozzles 15. Each of the pressure chambers 10 has a substantially elliptical planar shape with the scanning direction of the pressure chamber 10 as a longitudinal direction, and is formed such that a left-end portion of the pressure chamber 10 overlaps with one of the nozzles 15 in a plan view. Through holes 12 and 13 are formed in the base plate 22, at positions corresponding to both ends in the longitudinal direction of the pressure chamber 10 in a plan view.

Four manifold channels 11 extending in the paper feeding direction corresponding to the four nozzle rows 8 are formed in the manifold plate 23. Each of the manifold channels 11 overlaps with substantially right-half portions of the corresponding pressure chambers 10 in a plan view. An ink supply port 9 is formed at lower end portion of each of the manifold channels 11 in FIG. 2, and the ink is supplied to the manifold channel 11 from the ink supply port 9. Moreover, through holes 14 are formed in the manifold plate 23, at a position overlapping with the through holes 13 and the nozzles 15.

In the channel unit 31, the manifold channel 11 communicates with the pressure chambers 10 via the through holes 12, and the pressure chambers 10, communicate with the nozzles 15 via the through holes 13 and 14 respectively. In this manner, a plurality of individual ink channels from an exit of the manifold channel 11 to the nozzles 15 via the pressure chambers 10 is formed in the channel unit 31. Ink channels in which the individual ink channels and the manifold channels 11 are combined correspond to liquid transporting channels according to the present invention.

The piezoelectric actuator 32 has a vibration plate 40, piezoelectric thin layers 41 and 42, individual electrodes 43 (drive electrode), common electrodes 44 (reference electrode), connecting terminals 45, and connecting portions 46. The vibration plate 40 is made of an insulating material such as a synthetic resin or a piezoelectric material same as the piezoelectric thin layer 41 described later, and is joined to an upper surface of the cavity plate 21 to cover the pressure chambers 10.

The piezoelectric thin layers 41 and 42 are a mixed crystal of lead titanate and lead zirconate, and are made of a piezoelectric material having ferroelectric lead zirconium titanate (PZT) as a main constituent. The piezoelectric thin layers 41 and 42 are stacked mutually, and arranged continuously on an upper surface (on a side of the vibration plate 40 not facing the pressure chambers), of the vibration plate 40, spreading over the pressure chambers 10. Moreover, the piezoelectric thin layers 41 and 42 are polarized in advance in a thickness direction. A stacked body of the piezoelectric thin layer 41 and the piezoelectric thin layer 42 corresponds to a piezoelectric layer according to the present invention.

The individual electrodes 43 are provided on an upper surface (a surface of the piezoelectric layer on a side not facing the vibration plate 40), of the piezoelectric thin layer 42, corresponding to the pressure chambers 10. Each of the individual electrodes 43 has a substantially elliptical planar shape slightly smaller than the pressure chamber 10, and is arranged at a position facing a substantially central portion of one of the pressure chambers 10. Moreover, a right-end portion of each of the individual electrodes 43 in FIG. 3 is a projection 43a having a substantially central portion in the paper feeding direction projected toward right. The projections 43a are connected to the connecting portions 46 as it will be described later.

The common electrodes 44 each extending in the paper feeding direction (vertical direction in FIG. 2) are arranged in four rows. Each of the common electrodes 44 overlaps with the individual electrodes 43 corresponding to one of the nozzle rows 8, and is facing the corresponding individual electrodes 43. The common electrodes 44 are kept at a ground electric potential (a predetermined reference electric potential) all the time. Moreover, each of the common electrodes 44 does not extend to outside of portions of the individual electrodes 43 excluding the projections 43a, in the scanning direction.

Each of the connecting terminals 45 is arranged on an upper surface, of the piezoelectric thin layer 42, at a position not facing the pressure chamber 10 and being a right side of one of the individual electrodes 43 in FIG. 3 to be separated from the individual electrode 43. The connecting terminal 45 has a substantially rectangular planar shape with the paper feeding direction as a longitudinal direction. Here, each of the common electrodes 44, as it has been described above, does not extend to the outside of the portions of the individual electrodes 43, excluding the projections 43a, in the scanning direction. Therefore, the common electrode 44 and the connecting terminals 45 do not overlap in a plan view (the common electrode 44 and the connecting terminals 45 do not overlap in a stacking direction of the vibration plate 40 and the piezoelectric thin layers 41 and 42). Accordingly, a generation of a stray capacitance between the common electrode 44 and the connecting terminal 45 is prevented.

The connecting terminal 45 is connected to a wire 51a (an external wire) of a flexible printed circuit (FPC) 51 arranged on an upper side of the piezoelectric thin layer 42 via a solder 51. The FPC 51 (the wire 51a) is connected to a driver IC which is not shown in the diagram. In this case, since the connecting terminal 45 and the individual electrode 43 are arranged to be separated from each other, the solder 52 does not flow from a surface of the connecting terminal 45 to a surface of the individual electrode 43. In the embodiment, the connecting terminal 45 has an area such that the solder 52 does not flow outside the connecting terminal 45 even when an amount of the solder 52 which connects the connecting terminal 45 and the wire 51a of the FPC 51 becomes the maximum in a range of manufacturing variation.

The connecting portion 46 is formed to connect the individual electrode 43 and the connecting terminal 45, and is formed between the piezoelectric thin layer 41 and the piezoelectric thin layer 42. In other words, in the piezoelectric layer, the connecting portion 46 and the connecting terminal 45 are formed at different positions in a stacking direction of the piezoelectric thin layers 41 and 42. Moreover, as shown in FIG. 3, the connecting portion 46, in a plan view, extends in the scanning direction, from a position overlapping with the projection 43a of the individual electrode 43 to a position overlapping with a left-end portion of the connecting terminal 45.

Communicating passages 42a and communicating passages 42b are formed in the piezoelectric film 42. Each of the communicating passages 42a (a first communicating passage) extends, through the piezoelectric thin layer 42, from one of the projections 43a to one of the connecting portions 46 and communicates the projection 43a (individual electrode 43) and the connecting portion 46. Each of the communicating passages 42b (a second communicating passage) extends, through the piezoelectric thin layer 42, from one of the connecting terminals 45 to one of the connecting portions 46 and communicates the connecting terminal 45 and the connecting portion 46. Electroconductive materials 53 and 54 are filled in the communicating passages 42a and 42b respectively. The individual electrode 43 (the protrusion 43a) and the connecting portion 46 are connected via the electroconductive material 53, and the connecting terminal 45 and the connecting portion 46 are connected via the electroconductive material 54. Accordingly, the individual electrode 43 and the connecting terminal 45 are connected via the connecting portion 46 and the electroconductive materials 53 and 54, and a driving electric potential is applied to the individual electrode 43 from a driver IC not shown in the diagram, via the FPC 51, the connecting terminal 45, the electroconductive material 54, the connecting portion 46, and the electroconductive material 53.

Moreover, as it has been described above, in the piezoelectric actuator 32, the common electrodes 44 are arranged on the lower surface of the piezoelectric thin layer 41, and the connecting portions 46 are arranged between the piezoelectric thin layer 41 and the piezoelectric thin layer 42. In other words, the common electrodes 44 and the connecting portions 46 are arranged at different positions of the piezoelectric layer. Accordingly, a short-circuit between the common electrode 44 and the connecting portion 46 is prevented.

Furthermore, as it has been described above, since the common electrodes 44 do not extend to outside of the portion of the individual electrode 43 excluding the projection 43a in the scanning direction, the common electrode 44 and the connecting portion 46 are not facing in a plan view (the common electrodes 44 and the connecting portions 46 do not overlap in the stacking direction). Therefore, a generation of the stray capacitance between the common electrodes 44 and the connecting portions 46 is prevented.

The piezoelectric actuator 32 such as the one described above is manufactured by baking a green sheet of a piezoelectric material in which the individual electrodes 43, the common electrodes 44, the connecting terminals 45, and the connecting portions 46 are formed by a method such as printing. In this case, before baking the green sheet of the piezoelectric material, through holes which become the communicating passages 42a and 42b are formed in the green sheet which is to be the piezoelectric thin layer 42, and the electroconductive materials 53 and 54 are filled in these through holes in advance.

Moreover, it is possible to manufacture the piezoelectric actuator 32 by forming the piezoelectric thin layers 41 and 42 by using an aerosol deposition method (AD method) in which particles of a piezoelectric material are deposited by making collide the particles of a piezoelectric material on a surface of a substrate, and then forming the individual electrode 43, the common electrode 44, the connecting terminal 45, and the connecting portion 46 on a surface of the piezoelectric thin layers 41 and 42. In this case, at the time of forming the piezoelectric thin layer 42 by the AD method, the communicating passages 42a and 42b are formed in the piezoelectric thin layer 42 by making the particles of the piezoelectric material to be deposited only on portions excluding portions which becomes the communicating passages 42a and 42b.

Here, a method for driving the piezoelectric actuator 32 will be described below. In the piezoelectric actuator 32, an electric potential of the individual electrodes 43 is kept at a ground electric potential in advance by the driver IC not shown in the diagram. When a driving electric potential is applied to any of the individual electrodes 43 by the driver IC, an electric potential difference is developed between the individual electrode 43 to which the driving electric potential is applied, and the common electrode 44 which is kept at the ground electric potential, and an electric field in the thickness direction is generated in a portion of the piezoelectric thin layers 41 and 42 sandwiched between the individual electrode 43 and the common electrode 44. Since the electric field is directed parallel to a direction of polarization of the piezoelectric thin layers 41 and 42, the portions of the piezoelectric thin layers 41 and 42 sandwiched between the individual electrode 43 and the common electrode 44 contract in a horizontal direction which is orthogonal to the polarization direction. Accordingly, a portion of the vibration plate 40 and the piezoelectric thin layers 41 and 42 facing the pressure chamber 10 corresponding to the individual electrode 43 to which the driving electric potential is applied are deformed to project as a whole toward the pressure chamber 10, and a volume inside the pressure chamber 10 decreases. Accordingly, a pressure of the ink inside the pressure chamber 10 is increased, and the ink is jetted from the nozzle 15 communicating with the pressure chamber 10.

In this case, if the solder flows to the surface of the individual electrode 43, the deformation of the vibration plate 40 and the piezoelectric thin layers 41 and 42 is inhibited by the solder 52, and a change in the volume of the pressure chamber 10 becomes small, and there is a possibility that the pressure applied to the ink in the pressure chamber 10 decreases.

However, in the embodiment, the individual electrode 43 and the connecting terminal 45 are arranged to be mutually separated on an upper surface of the piezoelectric thin layer 42, and the individual electrode 43 and the connecting terminal 45, are mutually connected by the electroconductive materials 53 and 54 filled in the communicating passages 42a and 42b in the piezoelectric thin layer 42, and the connecting portion 46 arranged between the piezoelectric thin layer 41 and the piezoelectric thin layer 42, which is different from the upper surface of the piezoelectric thin layer 42. Therefore, when the connecting terminal 45 and the wire 51a of the FPC 51 are connected by the solder 52, the solder 52 does not flow from a surface of the connecting terminal 45 to a surface of the individual electrode 43, and the deformation of the vibration plate 40 and the piezoelectric thin layers 41 and 42 is not inhibited by the solder 52.

Furthermore, since the connecting terminal 45 is arranged not to face the pressure chamber 10, it is possible to prevent the deformation of the piezoelectric thin layers 41 and 42 and a portion of the vibration plate 40 facing the pressure chamber 10 from being inhibited by the solder 52 on the connecting terminal 45.

According to the embodiment described above, the individual electrode 43 and the connecting terminal 45 are arranged to be separated from each other on the upper surface of the piezoelectric thin layer 42, and the individual electrode 43 and the connecting terminal 45 are connected via the connecting portion 46 arranged between the piezoelectric thin layer 41 and the piezoelectric thin layer 42, and the electroconductive materials 53 and 54 filled in the communicating passages 42a and 42b formed in (on) the piezoelectric thin layer 42. Therefore, when the connecting terminal 45 is connected to the wire 51a of the FPC 51 by the solder 52, the solder 52 does not flow from the surface of the connecting terminal 45 to the surface of the individual electrode 43. Accordingly, it is possible to prevent the deformation of the piezoelectric thin layers 41 and 42, and the portion of the vibration plate 40 facing the pressure chamber 10 from being inhibited by the solder 52.

Moreover, since the common electrodes 44 and the connecting terminals 45 are arranged not to be overlapped with each other in a plan view, it is possible to prevent the generation of the stray capacitance between the common electrodes 44 and the connecting terminals 45, Moreover, the common electrodes 44 are arranged on the lower surface of the piezoelectric thin layer 41 and the connecting portions 46 are arranged between the piezoelectric thin layer 41 and the piezoelectric thin layer 42. In other words, the common electrodes 44 and the connecting portions 46 are arranged on different surfaces respectively. Furthermore, the common electrodes 44 and the connecting portions 46 are arranged not to overlap with each other in a plan view. Therefore, it is possible to prevent a short-circuit between the common electrodes 44 and the connecting portions 46, and the generation of the stray capacitance between the common electrodes 44 and the connecting portions 46.

Since the connecting terminals 45 are arranged not to face the pressure chambers 10, it is possible to prevent the deformation of the piezoelectric thin layers 41 and 42 and the portion of the vibration plate 40 facing the pressure chambers 10 from being inhibited by the solder 52 on the connecting terminals 45.

Next, modified embodiments in which various modifications are made in the embodiment will be described below. Same reference numerals are assigned to components which are similar as in the embodiment, and the description of such components is omitted.

First Modified Embodiment

Figure 6:
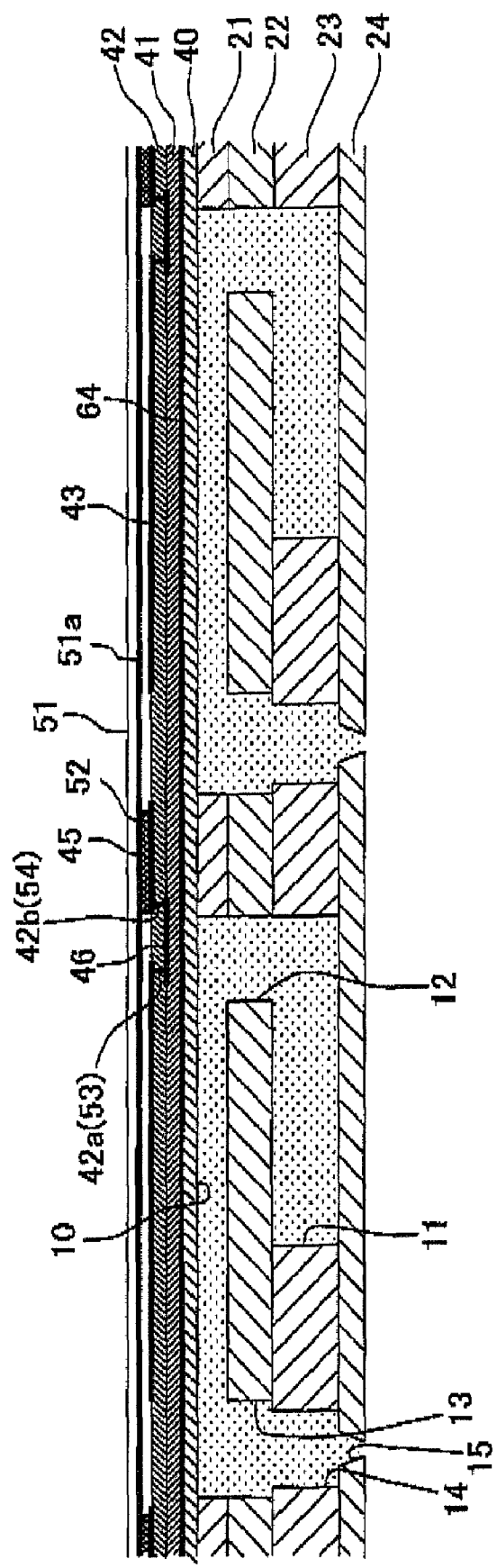
FIG. 6 is a diagram of a first modified embodiment, corresponding to FIG. 4.

In a first modified embodiment, as shown in FIG. 6, a common electrode 64 is arranged on almost the entire area of the lower surface of the piezoelectric thin layer 41, and the connecting terminals 45 and the connecting portions 46 overlap with the common electrode 64 in a plan view.

In this case, since the common electrode 64 is formed on almost the entire area of the lower surface of the piezoelectric thin layer 41, it is possible to form the common electrode 64 easily. In the first modified embodiment, the common electrode 64 is formed on almost the entire area of the lower surface of the piezoelectric thin layer 41, and overlaps with both the connecting terminals 45 and the connecting portions 46 in a plan view. However, the common electrode 64 may be arranged such that the common electrode 64 overlaps with one of the connecting terminals 45 and the connecting portions 46.

Figure 7:
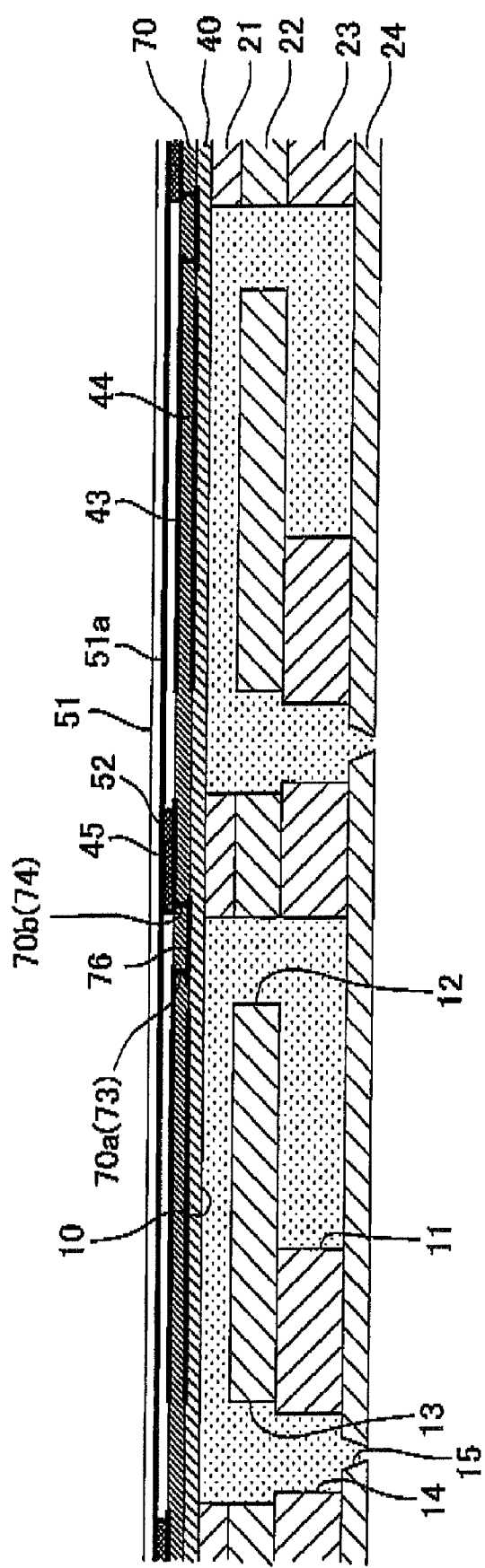
FIG. 7 is a diagram of a second modified embodiment, corresponding to FIG. 4.

Moreover, in the embodiment, the piezoelectric thin layers 41 and 42 are arranged to be stacked mutually on the upper surface of the vibration plate 40. However, the arrangement is not restricted to such arrangement. In a second modified embodiment, as shown in FIG. 7, a piezoelectric layer 70 is formed on the upper surface of the vibration plate 40, and the individual electrodes 43 and the connecting terminals 45 are arranged on an upper surface of the piezoelectric layer 70. Moreover, the common electrodes 44 and connecting portions 76 are arranged on a lower surface of the piezoelectric layer 70. The connecting portions 76 face projections 43a of the individual electrodes 43 and the connecting terminals 45 in a plan view, and are arranged to be separated from the common electrodes 44. Furthermore, communicating passages 70a (a first communicating passage) which communicate the projections 43a (individual electrode 43) and the connecting portions 76 respectively are formed in portions of the piezoelectric layer 70 overlapping with both of the connecting terminals 45 and the connecting portions 46 in a plan view. Communicating passages 70b which communicate the connecting terminals 45 and the connecting portions 46 respectively are formed in a portion of the piezoelectric layer 70 overlapping with both the connecting terminals 45 and the connecting portions 76 in a plan view. Electroconductive materials 73 and 74 are filled in the communicating passages 70a and 70b respectively, and the individual electrodes 43 and the connecting portions 76 are connected via the electroconductive material 73, and the connecting portions 76 and the connecting terminals 45 are connected via the electroconductive material 74.

In this manner, the common electrodes 44 and the connecting portions 76 may be arranged on the same surface. Even in this case, when the common electrodes 44 and the connecting portions 76 are separated sufficiently, it is possible to prevent the short-circuit between the common electrodes 44 and the connecting portions 76.

Third Modified Embodiment

Figure 8:
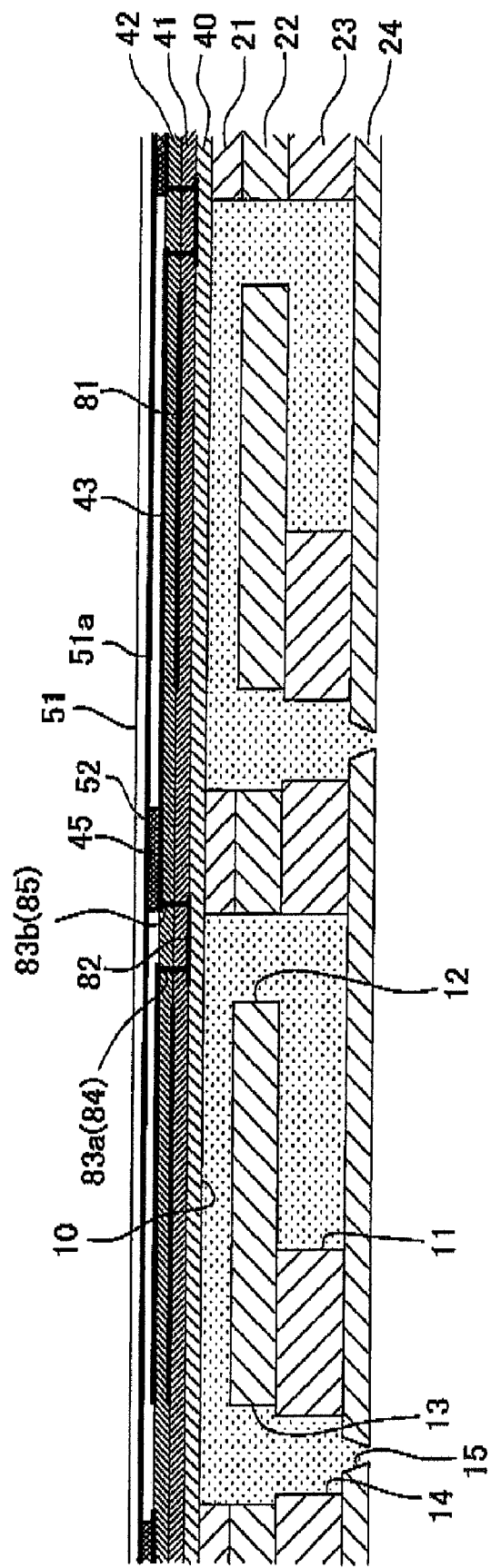
FIG. 8 is a diagram of a third modified embodiment, corresponding to FIG. 4.

Moreover, even when the piezoelectric thin layer 41 and the piezoelectric thin layer 42 are stacked, a positional relationship of the common electrodes and the connecting portions is not restricted to the positional relationship in the embodiment. In a third modified embodiment, as shown in FIG. 8, common electrodes 81 are arranged between the piezoelectric thin layer 41 and the piezoelectric thin layer 42, and connecting portions 82 are formed on the lower surface of the piezoelectric thin layer 41. In other words, the common electrode 81 and the connecting portion 82 are arranged on mutually different surfaces of the piezoelectric thin layers 41 and 42. In the piezoelectric thin layers 41 and 42, communicating passages 83a (a first communicating passage) and a communicating passage 83b (a second communicating passage) which are formed through the piezoelectric thin layers 41 and 42, and which communicate the projections 43a and the connecting portions 82, and the connecting portions 82 and the connecting terminals 45 respectively are formed. Electroconductive materials 84 and 85 such as a metal are filled in the communicating passages 83a and the communicating passages 83b respectively. Moreover, the individual electrodes 43 (the projection 43a) and the connecting portions 82 are connected via the electroconductive material 84, and the connecting portions 82 and the connecting terminals 45 axe connected via the electroconductive material 85.

Fourth Modified Embodiment

Figure 9:
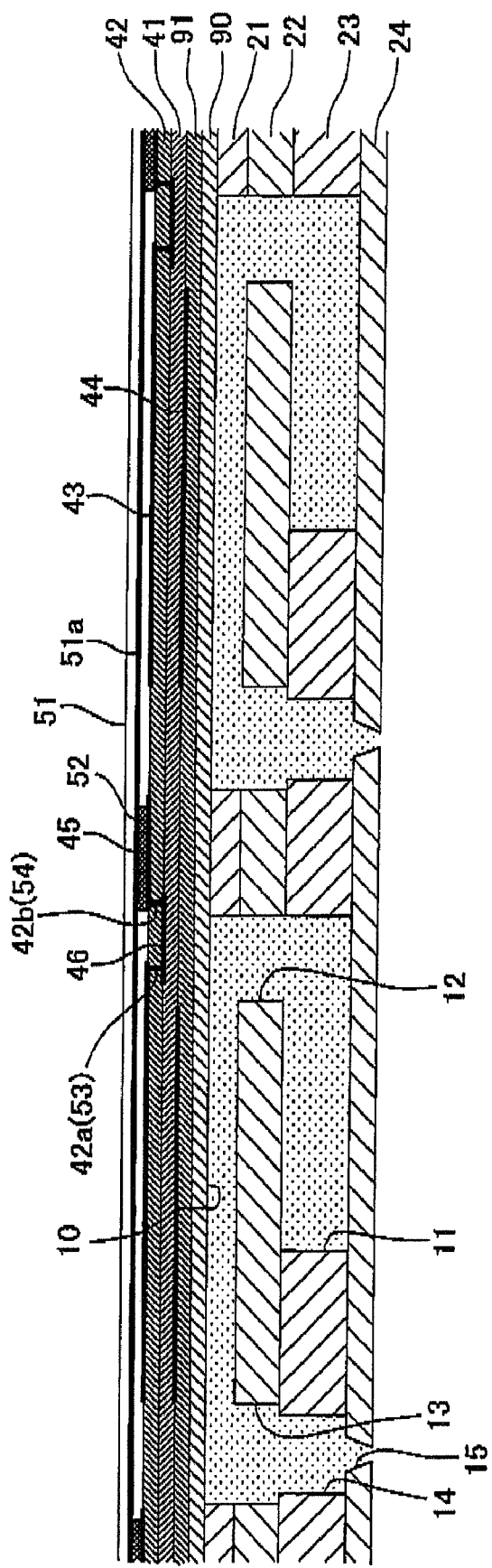
FIG. 9 is a diagram of a fourth modified embodiment, corresponding to FIG. 4.

In the embodiment, the vibration plate 40 is made of an insulating material. However, the material of the vibration plate 40 is not restricted to an insulating material. In a fourth modified embodiment, as shown in FIG. 9, a vibration plate 90 is made of an electroconductive material such as a metal, and a piezoelectric thin layer 91 is formed between a vibration plate 90 and the piezoelectric thin layer 41. In this case, the three stacked piezoelectric thin layers 41, 42, and 91 correspond to a piezoelectric layer according to the present invention. In this manner, when the common electrodes and the connecting portions are not arranged on a surface of the piezoelectric layer not joined to the vibration plate (a lower surface of the piezoelectric thin layer 91 in the fourth modified embodiment), the vibration plate may be formed of an electroconductive material.

Furthermore, the number of piezoelectric thin layers is not restricted to two as in the embodiment, or three as in the fourth modified embodiment. Four or more piezoelectric thin layers may be stacked, and the individual electrode 43 and the connecting terminal 45 may be formed on an upper surface of the piezoelectric layer (a surface of the piezoelectric layer not facing the vibration plate) positioned at the top (on a side opposite to the vibration plate), and common electrodes and connecting portions may be formed on a surface different from the surface, of the piezoelectric thin layer, on which the individual electrodes 43 and the connecting terminals 45 are formed.

Fifth Modified Embodiment

Figure 10:
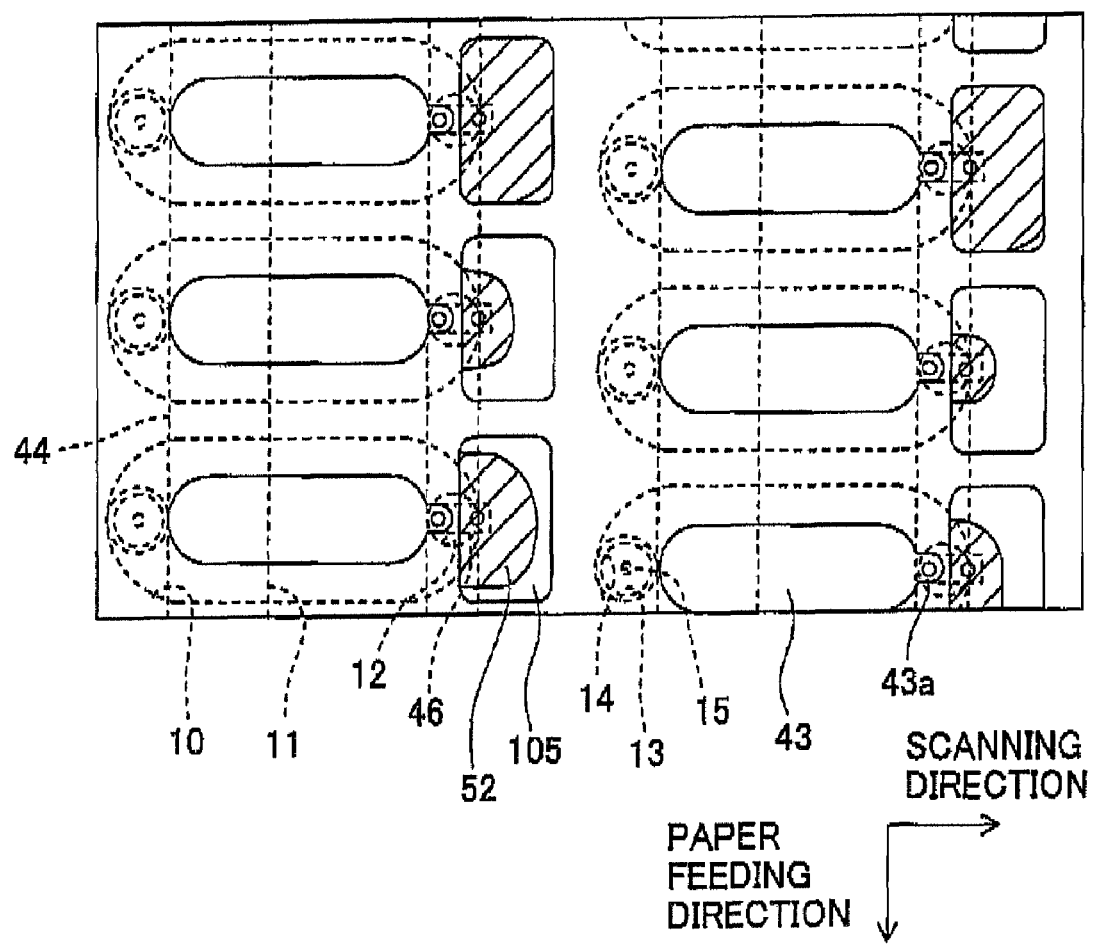
FIG. 10 is a diagram of a fifth modified embodiment, corresponding to FIG. 3.

In the embodiment, the connecting terminals 45 and the pressure chambers 10 are arranged not to face in a plan view, However, the arrangement is not restricted to such arrangement. In a fifth modified embodiment, as shown in FIG. 10, left-end portions of connecting terminals 105 face right-end portions of the pressure chambers 10 in a plan view respectively.

A portion, of the vibration plate 40 and the piezoelectric thin layers 41 and 42, facing a substantially central portion of each of the pressure chambers 10 is deformed most substantially. Therefore, even if the solder 52 flows to a left-end portions of the connecting terminals 105, in other words, portions facing right-end portions of the pressure chambers 10, the deformation of the vibration plate 40 and the piezoelectric thin layers 41 and 42 is not inhibited substantially by the solder 52.

In the present invention, the connecting terminals 45 and the wires 51a of the FPC 51 are connected by the solder 52. However, the connecting terminals 45 and the wires 51a of the FPC 51 may be connected by a material in a liquid form which becomes hard after applying, such as a thermosetting adhesive including a metal. Even in this case, since the individual electrodes 43 and the connecting terminals 45 are not connected on the upper surface of the piezoelectric thin layer 42, the thermosetting adhesive does not flow from the surfaces of the connecting terminals 45 to the surfaces of the individual electrodes 43.

In the embodiment, the piezoelectric layer 41 is arranged on the upper surface of the vibration plate 40. However, an intermediate layer other than the piezoelectric layer may be arranged on the upper surface of the vibration plate 40, and the piezoelectric layer 41 may be arranged on an upper surface of the intermediate layer (on a side opposite to the vibration plate 40). In this case, the common electrodes 44 are arranged between the intermediate layer and the piezoelectric layer 41.

Examples in which the present invention is applied to a piezoelectric actuator which applies a pressure to the ink in the pressure chambers communicating with the nozzles, and an ink-jet head which includes such piezoelectric actuator are described above. However, the range of application of the present invention is not restricted to this. The present invention is also applicable to a liquid transporting apparatus which jets a liquid other than ink from the nozzles, or which transports a liquid in a liquid channel communicating with the pressure chamber by applying a pressure to the liquid in the pressure chamber. Moreover, the present invention is also applicable to a piezoelectric actuator which drives predetermined portions to be driven other than the pressure chambers.

What is claimed is:

1. A liquid transporting apparatus which transports a liquid, comprising:

a channel unit having a liquid transporting channel which includes a pressure chamber and through which the liquid is transported; and a piezoelectric actuator which applies a pressure to the liquid in the pressure chamber, the piezoelectric actuator including: a vibration plate covering the pressure chamber; a piezoelectric layer disposed on a surface, of the vibration plate, not facing the pressure chamber; a drive electrode which is formed on a surface, of the piezoelectric layer, not facing the vibration plate and which faces the pressure chamber; a connecting terminal which is formed on the surface, of the piezoelectric layer, not facing the vibration plate to be separated from the drive electrode, and which is connectable to an external wire; a connecting portion which is formed on the piezoelectric layer and which connects the drive electrode and the connecting terminal; and a first communicating passage and a second communicating passage which are formed in the piezoelectric layer;

wherein the connecting portion is formed at a position, in a thickness direction of the piezoelectric layer, which is different from a position at which the drive electrode and the connecting terminal are formed;

the drive electrode and the connecting portion are connected via an electroconductive material which is filled in the first communicating passage; and the connecting portion and the connecting terminal are connected via an electroconductive material which is filled in the second communicating passage.

2. The liquid transporting apparatus according to claim 1, further comprising a reference electrode which is formed on the piezoelectric layer to face the drive electrode and which is kept at a predetermined reference electric potential, wherein the reference electrode is formed at a position, in the thickness direction of the piezoelectric layer, which is different from the position at which the drive electrode and the connecting terminal are formed, and the reference electrode does not face the connecting terminal.

3. The liquid transporting apparatus according to claim 2, wherein the piezoelectric layer is formed by a plurality of thin layers which are stacked with each other, and the connecting portion and the reference electrode are formed on different surfaces of the thin layers respectively.

4. The liquid transporting apparatus according to claim 3, wherein the connecting portion and the reference electrode do not face with each other.

5. The liquid transporting apparatus according to claim 1, wherein the connecting terminal does not face the pressure chamber.

6. The liquid transporting apparatus according to claim 1, further comprising a reference electrode which is formed entirely on a surface, of the piezoelectric layer, facing the vibration plate and which is kept at a predetermined reference electric potential.

7. The liquid transporting apparatus according to claim 1, further comprising a reference electrode which is formed on a surface, of the piezoelectric layer, facing the vibration plate to face the drive electrode and which is kept at a predetermined reference electric potential, wherein the connecting portion is formed on the surface, of the piezoelectric layer, facing the vibration plate to be separated from the reference electrode.

8. A piezoelectric actuator comprising:

a vibration plate;

a piezoelectric layer which is arranged on one surface of the vibration plate;

a drive electrode which is formed on a surface, of the piezoelectric layer, not facing the vibration plate;

a connecting terminal which is formed on the surface, of the piezoelectric layer, not facing the vibration plate to be separated from the drive electrode;

a connecting portion which is formed on the piezoelectric layer, and which connects the drive electrode and the connecting terminal; and a first communicating passage and a second communicating passage which are formed in the piezoelectric layer;

wherein the connecting portion is formed at a position, in a thickness direction of the piezoelectric layer, which is different from a position at which the drive electrode and the connecting terminal are formed;

the drive electrode and the connecting portion are connected via an electroconductive material which is filled in the first communicating passage; and the connecting portion and the connecting terminal are connected via an electroconductive material which is filled in the second communicating passage.

9. The piezoelectric actuator according to claim 8, further comprising a reference electrode which is formed on the piezoelectric layer to face the drive electrode and which is kept at a predetermined reference electric potential, wherein the reference electrode is formed at a position, in the thickness direction of the piezoelectric layer, which is different from the position at which the drive electrode and the connecting terminal are formed, and does not face the connecting terminal.

10. The piezoelectric actuator according to claim 9, wherein the piezoelectric layer is formed by a plurality of thin layers which are stacked with each other, and the connecting portion and the reference electrode are formed on different surfaces of the thin layers respectively.

11. The piezoelectric actuator according to claim 10, wherein the connecting portion and the reference electrode do not face with each other.

* * * * *